United States Patent
Luce et al.

(10) Patent No.: US 7,183,656 B2
(45) Date of Patent: Feb. 27, 2007

(54) BILAYER ALUMINUM LAST METAL FOR INTERCONNECTS AND WIREBOND PADS

(75) Inventors: Stephen E. Luce, Underhill, VT (US); Thomas L. McDevitt, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,882

(22) Filed: Jan. 25, 2005

(65) Prior Publication Data

US 2006/0163706 A1   Jul. 27, 2006

(51) Int. Cl.
H01L 23/48 (2006.01)
H01L 23/52 (2006.01)
H01L 29/40 (2006.01)

(52) U.S. Cl. .............. 257/780; 257/779; 257/781; 257/784; 257/748; 257/750; 257/E21.088; 257/E21.122

(58) Field of Classification Search .............. None
See application file for complete search history.

(56) References Cited

U.S. PATENT DOCUMENTS

| | | | |
|---|---|---|---|
| 6,187,680 B1 | 2/2001 | Costrini et al. | |
| 6,376,353 B1 | 4/2002 | Zhou et al. | |
| 6,507,112 B1 | 1/2003 | Kurihara et al. | |
| 6,560,862 B1 | 5/2003 | Chen et al. | |
| 6,620,728 B2 * | 9/2003 | Lin | 438/637 |
| 6,631,077 B2 * | 10/2003 | Zuo | 361/699 |
| 6,642,623 B2 | 11/2003 | McTeer | |
| 6,677,228 B1 | 1/2004 | Su et al. | |
| 6,779,711 B2 | 8/2004 | Edelstein et al. | |

* cited by examiner

*Primary Examiner*—Jasmine Clark
(74) *Attorney, Agent, or Firm*—DeLio & Peterson, LLC; Peter W. Peterson; William D. Sabo

(57) ABSTRACT

A method for connecting a microelectronic device to a wirebond comprises providing a substrate having a microelectronic circuit therein and forming a wiring layer over the substrate. The wiring layer includes a bilayer wiring structure comprising upper and lower electrically conductive layers separated by a protective electrically conductive layer. The lower layer of the bilayer structure is at the level of the wiring layer and the upper layer of the bilayer structure extends above the level of the wiring layer. The bilayer wiring structure is formed by depositing the upper and lower electrically conductive layers separated by a protective electrically conductive layer over the substrate, etching the upper electrically conductive layer and a portion of the protective electrically conductive layer, and thereafter separately etching the lower electrically conductive layer to form the wiring layer over the substrate. The method also includes connecting a wirebond to the upper layer of the bilayer structure.

20 Claims, 6 Drawing Sheets

BILAYER ALUMINUM LAST METAL FOR INTERCONNECTS AND WIREBOND PADS

BACKGROUND OF THE INVENTION

1. Field of the Invention

The present invention relates to the packaging of integrated circuits and, in particular, to a structure and method for making wirebond connections to microelectronic devices.

2. Description of Related Art

Wirebond connections are made to wiring levels of microelectronic devices in order to electrically connect the circuits of the microelectronic device to a larger connector formed in the package supporting the microelectronic device. With decreasing size of circuitry on microelectronic devices, wirebond balls have likewise diminished in size. With microelectronic device wiring level thickness now being at the level of approximately 500 nm and wire widths in the range of about 300–400 nm, wirebond ball sizes have also decreased. The decrease in wirebond ball size from 70 μm to 50 μm has been difficult because of the aforementioned decrease in metal layer thickness. These 50 μm wirebonds have in some cases been unable to pass stud pull stressing. One solution to this problem, increasing the thickness of the last wiring level to approximately 1 μm, is not desirable because with the wire width in the 200–400 nm size, the aspect ratio and capacitance of this last wiring level would be unacceptably high. Another solution has been to add an additional wiring level whose only function is to allow the use of the 50 μm wirebonds. However this adds significant cost. Accordingly, there is a need in the art for an improved wirebond structure that permits a connection of 50 μm wirebond which passes industry stress tests.

SUMMARY OF THE INVENTION

Bearing in mind the problems and deficiencies of the prior art, it is therefore an object of the present invention to provide an improved method and structure for connecting wirebonds with ball size of approximately 50 μm and smaller to the last metal interconnect on a microelectronic device.

It is another object of the present invention to provide a structure and method for connecting 50 μm wirebond ball sizes to a microelectronic device which does not have significant additional structure.

Still other objects and advantages of the invention will in part be obvious and will in part be apparent from the specification.

The above and other objects, which will be apparent to those skilled in the art, are achieved in the present invention which is directed to a structure for connecting a microelectronic device to a wirebond comprising a substrate having a microelectronic circuit therein and a wiring layer over the substrate. The invention also includes a bilayer wiring structure comprising upper and lower electrically conductive layers separated by a protective electrically conductive layer, with the lower layer of the bilayer structure being at the level of the wiring layer and the upper layer of the bilayer structure extending above the level of the wiring layer. Preferably, the structure of claim 1 further includes a wirebond connected to the upper layer of the bilayer structure.

In another aspect, the present invention is directed to a method for connecting a microelectronic device to a wirebond comprising providing a substrate having a microelectronic circuit therein and forming a wiring layer over the substrate. The wiring layer includes a bilayer wiring structure comprising upper and lower electrically conductive layers separated by a protective electrically conductive layer. The lower layer of the bilayer structure is at the level of the wiring layer and the upper layer of the bilayer structure extends above the level of the wiring layer. The method also includes connecting a wirebond to the upper layer of the bilayer structure.

Preferably, the bilayer wiring structure is formed by depositing the upper and lower electrically conductive layers separated by a protective electrically conductive layer over the substrate, etching the upper electrically conductive layer and a portion of the protective electrically conductive layer, and thereafter separately etching the lower electrically conductive layer to form the wiring layer over the substrate.

In a further aspect, the present invention relates to a microelectronic device structure comprising a substrate having a microelectronic circuit therein, a wiring layer over the substrate; and the bilayer wiring structure described above, wherein the bilayer wiring structure is connected in parallel and forms a device, such as a spiral inductor or transmission line. Also, the present invention is directed to a method of making the electronic device structure.

In preferred embodiments of the above, the wiring layer has a thickness no greater than about 500 nm, and the upper layer of the bilayer structure has substantially the same thickness as the wiring level. The lower and upper layers of the bilayer structure may each have substantially the same thickness as the wiring level.

Preferably, the wiring layer and upper and lower layers of the bilayer structure comprise aluminum or an aluminum alloy. The protective layer preferably has a thickness substantially less than the upper and lower layers of the bilayer structure, preferably about 10 to 100 nm, and is a refractory selected from the group consisting of TiN, TaN, TiSiN, WN, W, Ta, TiAl or combinations thereof.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–12 of the drawings in which like numerals refer to like features of the invention.

Instead of i) adding additional wiring levels only for the wirebond and/or ii) creating an unacceptable high thickness of the last aluminum copper wiring level, the present invention provides a dual thickness last wiring level with on-pitch wires, e.g. wires approximately 500 nm high, and wirebond pads of approximately greater than twice the height, e.g., approximately 1 µm or thicker. The present invention may be used to fabricate dual height wiring of any desired thickness for any purpose.

Figure 1:
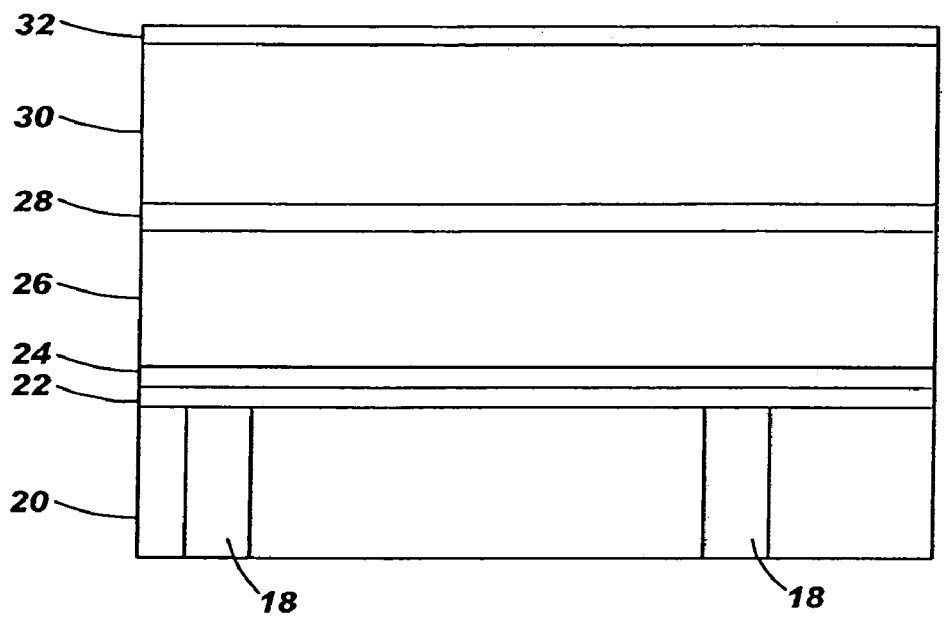
FIG. 1 is a side elevational view, in cross section, of a pair of aluminum layers, separated by a protective electrically conductive layer, used to form the bilayer aluminum last metal interconnect in accordance with the present invention.

As shown in FIG. 1, the double layer metal stack comprises an underlying substrate layer 20, a titanium layer 22, here shown as being approximately 25 nm thick, and superimposed thereover a titanium nitride (TiN) layer 24, also shown as approximately 25 nm thick. The materials used for layers 22 and 24, in this case, are used to contact damascene tungsten vias 18. If layer 18 is a copper layer, then an additional layer of a refractory metal such as TaN would be used between layers 22 and 18. The substrate 20 contains desired microelectronic circuits (not shown in detail) needed for the microelectronic device. Above the titanium nitride layer 24, there is a first layer 26 of aluminum to be employed for the last wiring layer of the device, preferably AlCu (99.5% by wt. Al, 0.5% by wt. Cu), shown as having a thickness of 500 nm. Over the first aluminum layer is an optional layer of titanium nitride 28 here shown as being approximately 100 nm thick. Over the titanium nitride layer 28, there is a second aluminum layer 30, here again shown as AlCu having a thickness of approximately 500 nm. Finally over the second aluminum layer there is a titanium nitride layer 32, here shown as approximately 25 nm thick. The titanium nitride layers protect the aluminum from the effects of the photoresist layer, and other electrically conductive protective compositions may be employed such as tantalum nitride (TaN), titanium silicon nitride (TiSiN), tungsten nitride (WN), tungsten (W), tantalum (Ta), titanium-aluminum alloys (TiAl) and other refractories. Layer 32 could also consist wholly or partially of a dielectric anti-reflective coating (ARC) layer, such as $SiO_xN_y$.

Figure 2:
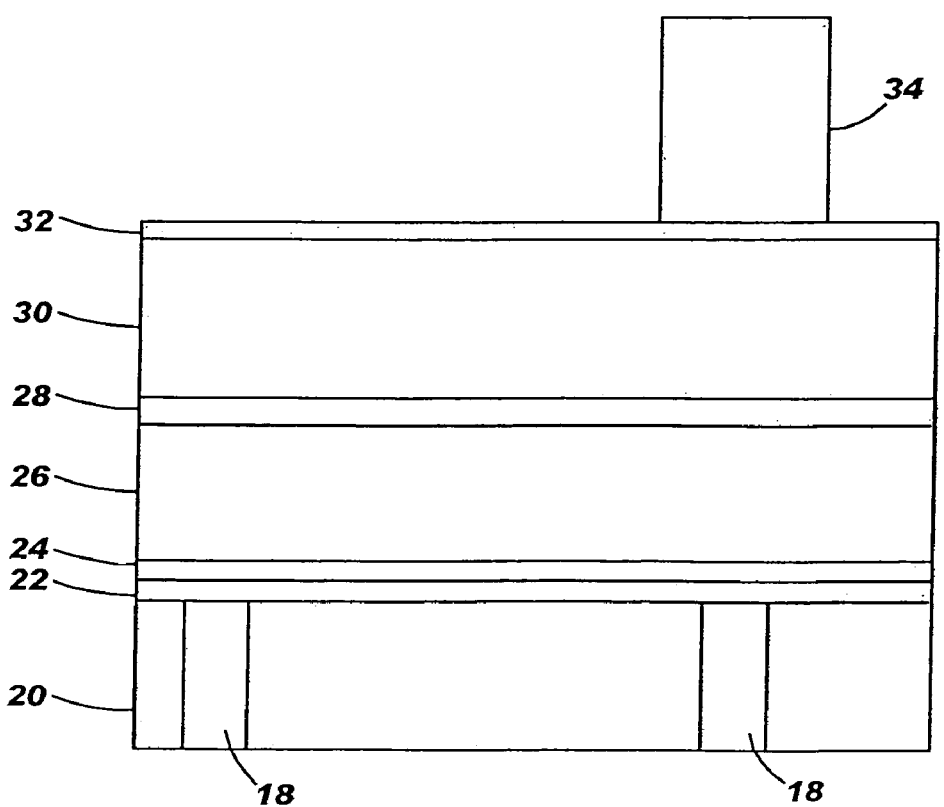
FIG. 2 is a cross sectional view of the structure of FIG. 1, with an additional photoresist layer added.
Figure 3:
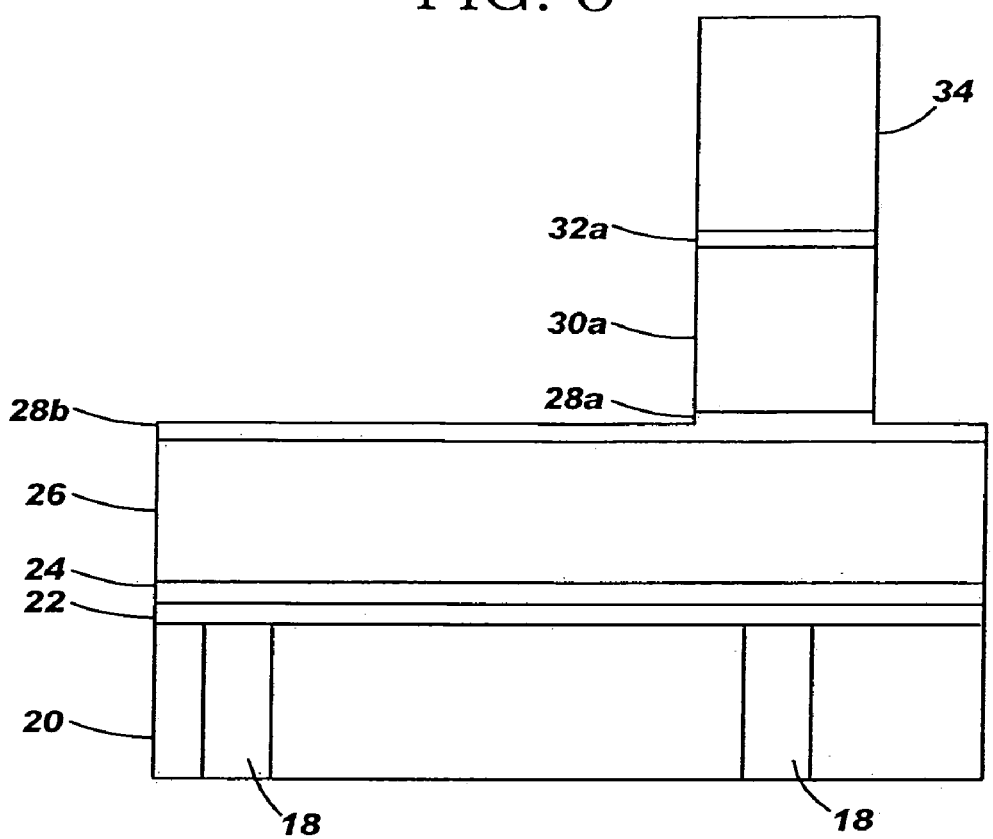
FIG. 3 is a cross sectional view of the structure of FIG. 2, after the photoresist layer has been used to etch a portion of the upper aluminum layer.
Figure 4:
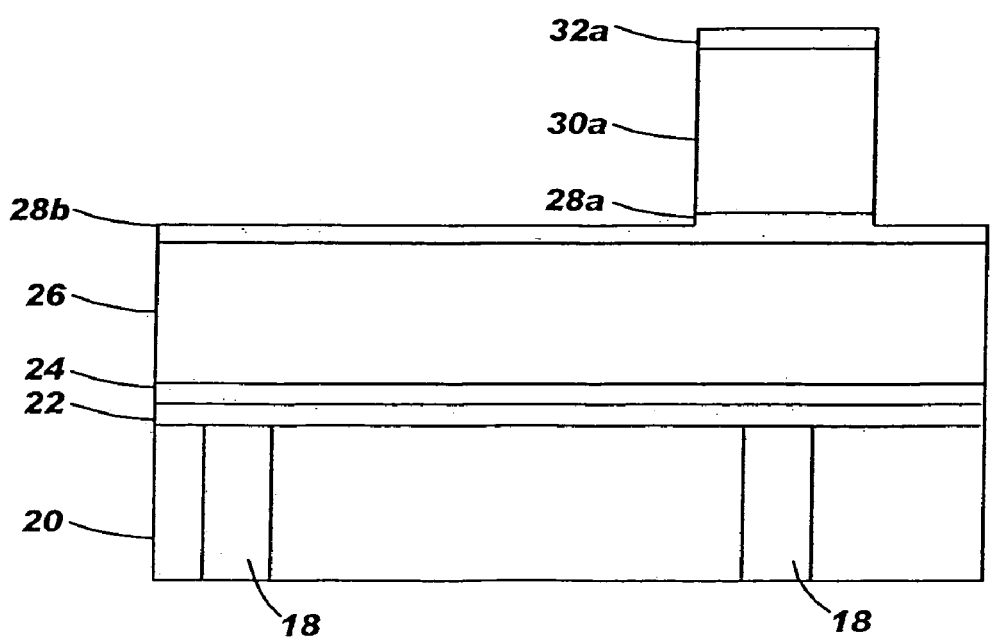
FIG. 4 is a cross section of the structure of FIG. 3, after the photoresist layer has been removed.

This double layer metal stack is lithographically defined and etched twice to create the preferred wiring and wirebond pad layers. As shown in FIG. 2, a photoresist layer is deposited over a portion of titanium nitride layer 32, exposed and developed 34 to define the area that will not be etched, and create the ultimate wirebond pad. Photoresist layer 34 may contain one or more ARC layers, as known in the art. As shown in FIG. 3, the first etching is made such that the etch stops on the middle titanium nitride layer, so that a portion thereof 28a is unetched, while another portion 28b is partially etched. Alternatively, layer 28 can be completely removed by etching, and a portion of layer 26 etched. This removes the upper aluminum layer, except that portion 30a below the photoresist layer 34. The end point of this etching can be preferably optically determined using Al—F emissions to determine when the etching has reached the second or middle titanium nitride layer; or the etch can be run for a fixed time. FIG. 4 shows the results after the first patterning and etch after the photoresist layer has been removed. This first patterning and etch may be used only for large wirebond pads e.g. approximately 60 µm width in size. Alternatively this can be used for either pads or wires.

Figure 5:
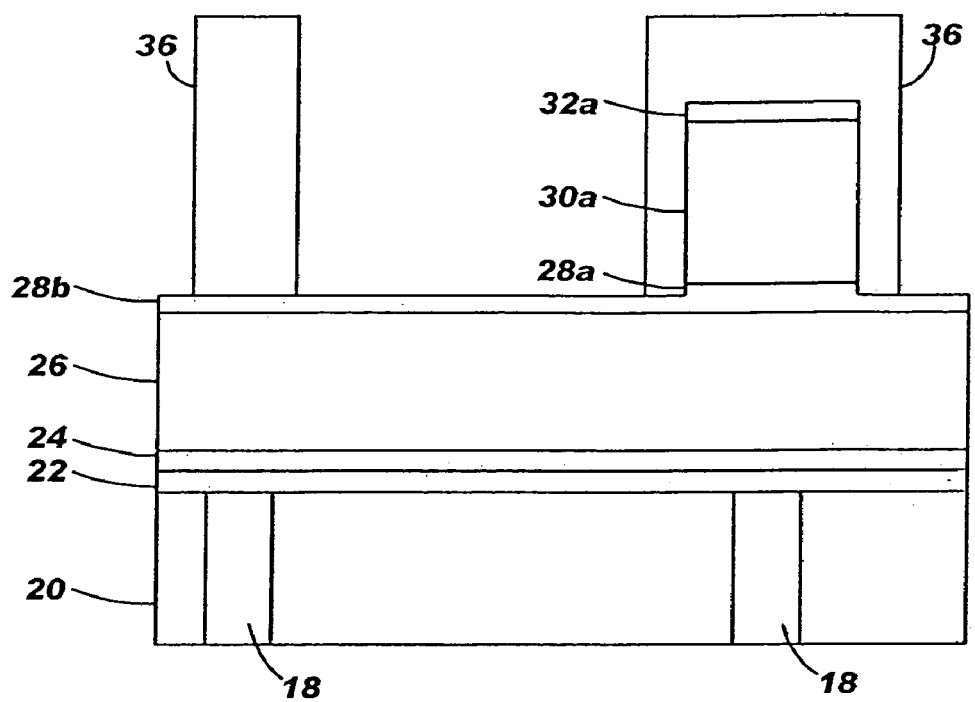
FIG. 5 is a cross sectional view of the structure of FIG. 4, with the addition of another photoresist layer.

To provide the structure for fine pitch wiring a second patterning is employed. In FIG. 5, this second patterning is begun by adding an additional or second photoresist layer, which is exposed and developed 36 to create an opening above the lower aluminum layer 26 adjacent to the remaining portion of the upper aluminum layer 30a. Again photoresist layer 36 may contain one or more ARC layers, as known in the art. After etching, shown in FIG. 6, an opening is etched through the remaining middle titanium nitride layer 28b, the lower aluminum layer 26a, the lower titanium nitride layer 24a and the lower titanium layer 22a and into a portion of the substrate. This etching leaves a portion of the substrate 20a unetched while the remaining portion 20b is etched. The resulting opening is shown in FIG. 7 after the additional photoresist pattern has been removed. The lower aluminum wiring layer portions 26a show the width of the wiring employed, while the upper aluminum layer 30a shows the wirebond pad created in accordance with the present invention. While the wirebond pad 30a has a thickness of, for example, 1 µm, it may have width and length dimensions, for example, of 70 µm by 70 µm to provide a suitable area for connection to the wirebond (described further below).

Figure 6:
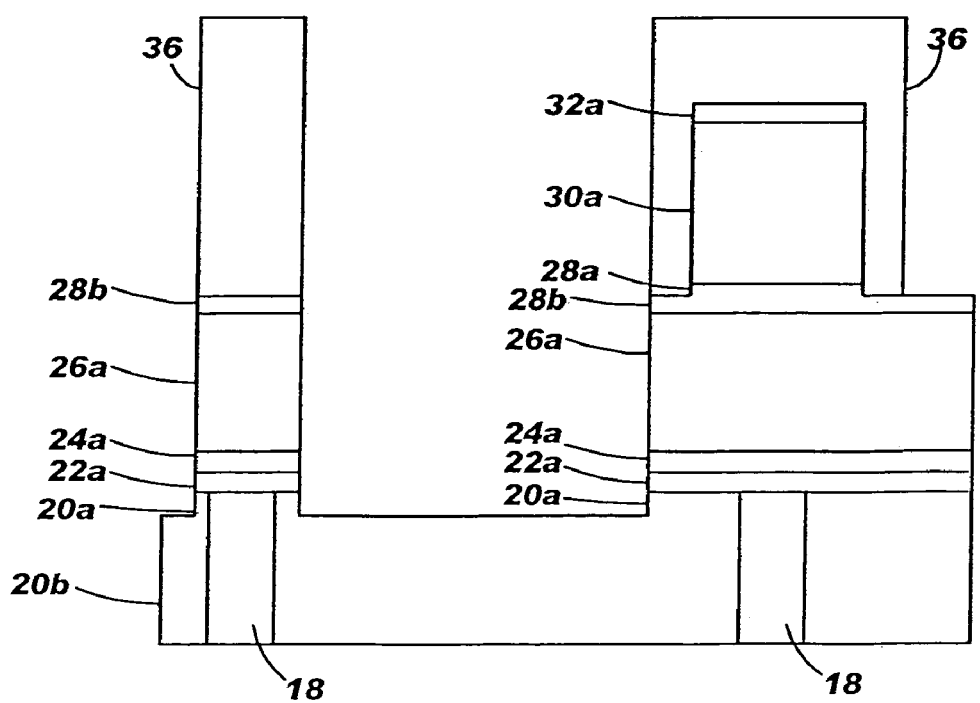
FIG. 6 is a cross sectional view of the structure of FIG. 5, after the additional photoresist layer has been used to etch the lower aluminum layer.
Figure 7:
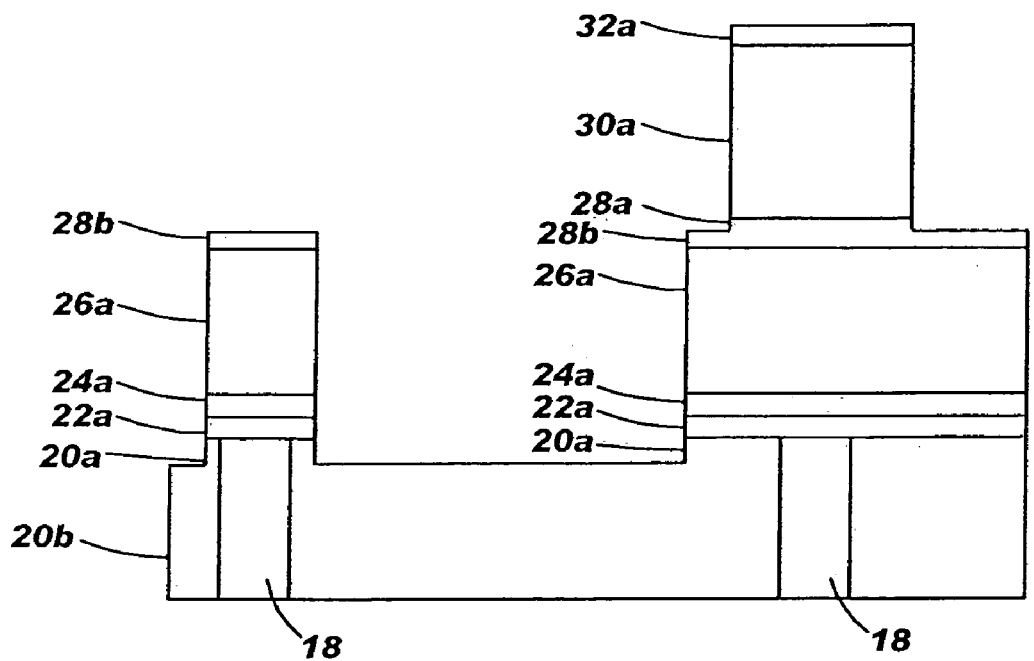
FIG. 7 is cross sectional view of the structure of FIG. 6, after the removal of the additional photoresist layer.

The lower aluminum wiring layer 26a, particularly as shown on the left in FIG. 6, may be used for fine pitch wires having about a 250 nm width, and a maximum aspect ratio of from about 0.5 to 2.5 (height/width).

During the lithographic patterning and etching of the lower wire layer, the corners of the upper wiring layer may become exposed due to poor resist coverage. If the upper layer patterning is only used to make wirebond pads 30a, then resist erosion in the upper metal corners of the wirebond pads during the lower wiring layer etch process would likely not be important. If the upper layer wiring 30a is also to be used as a wiring level, then the second patterning step photoresist thickness and/or reactive ion etching process should preferably be tailored such that the upper layer metal corners were not exposed during the lower metal layer reactive ion etching step. In general, the fine pitch wiring 26a on the lower layer would have about one-half of the minimum pitch of the upper layer thick wiring 30a.

Figure 8:
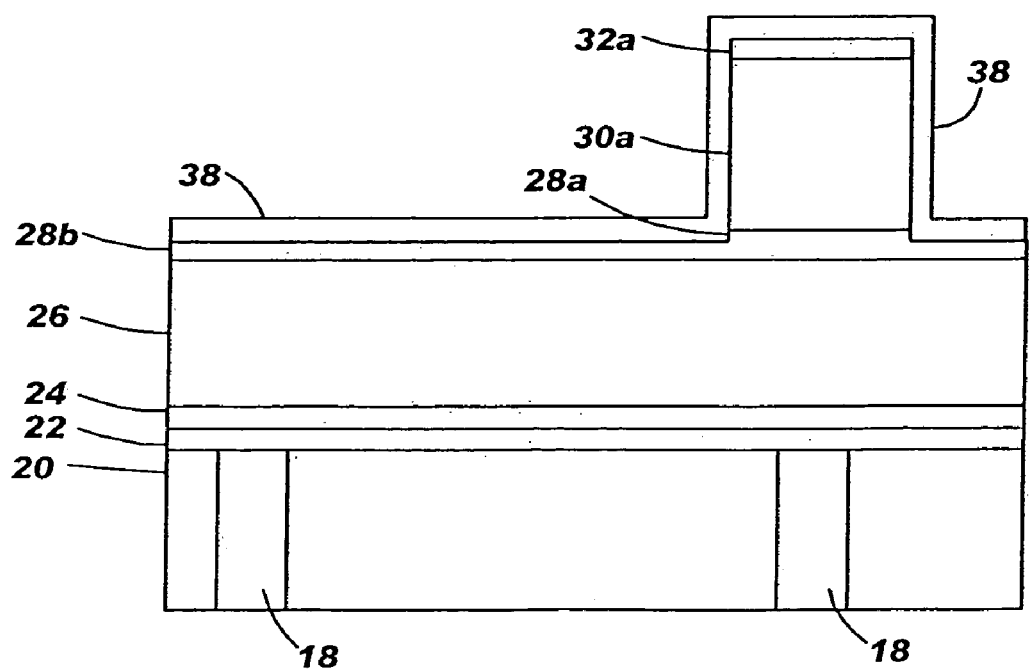
FIG. 8 is a side elevational view, in cross section, of the structure of FIG. 4 after the application of a dielectric anti-reflective coating layer.

In one option, a dielectric anti-reflective coating (DARC) may be employed for the more critical lower layer lithography step. As shown in FIG. 8, the DARC layer 38 is applied to the partially etched structure between the steps shown previously in FIGS. 4 and 5. Either a spin-on or chemical vapor deposited organic DARC layer may be employed. The photoresist patterning and etching then proceeds as previously described, with the final structure shown in FIG. 9.

Figure 9:
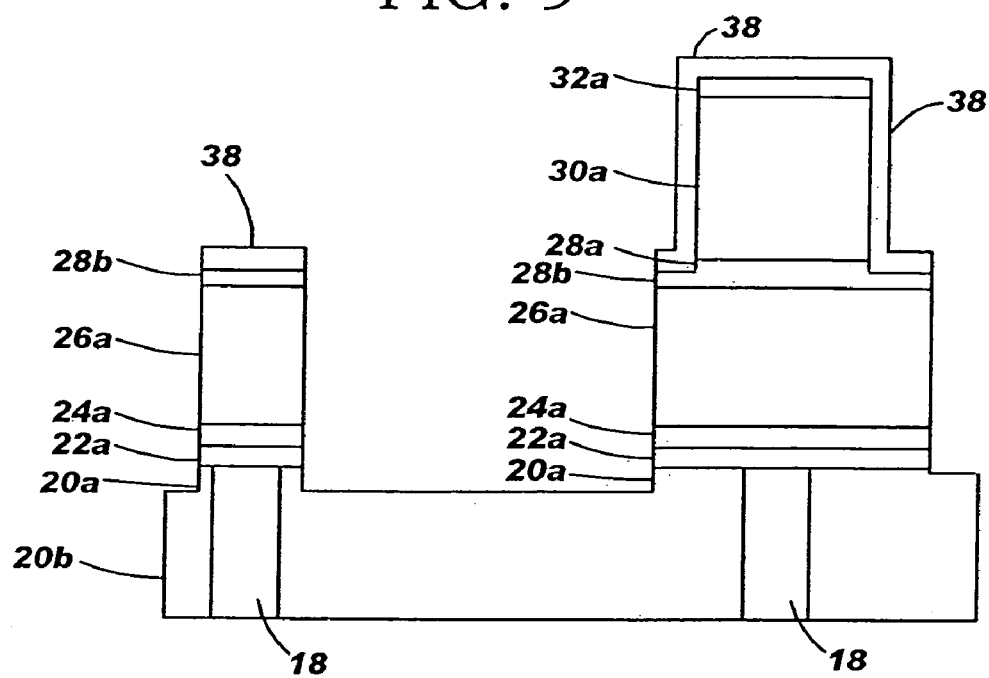
FIG. 9 is cross sectional view of the structure of FIG. 8, after the etching of the lower aluminum layer.
Figure 10:
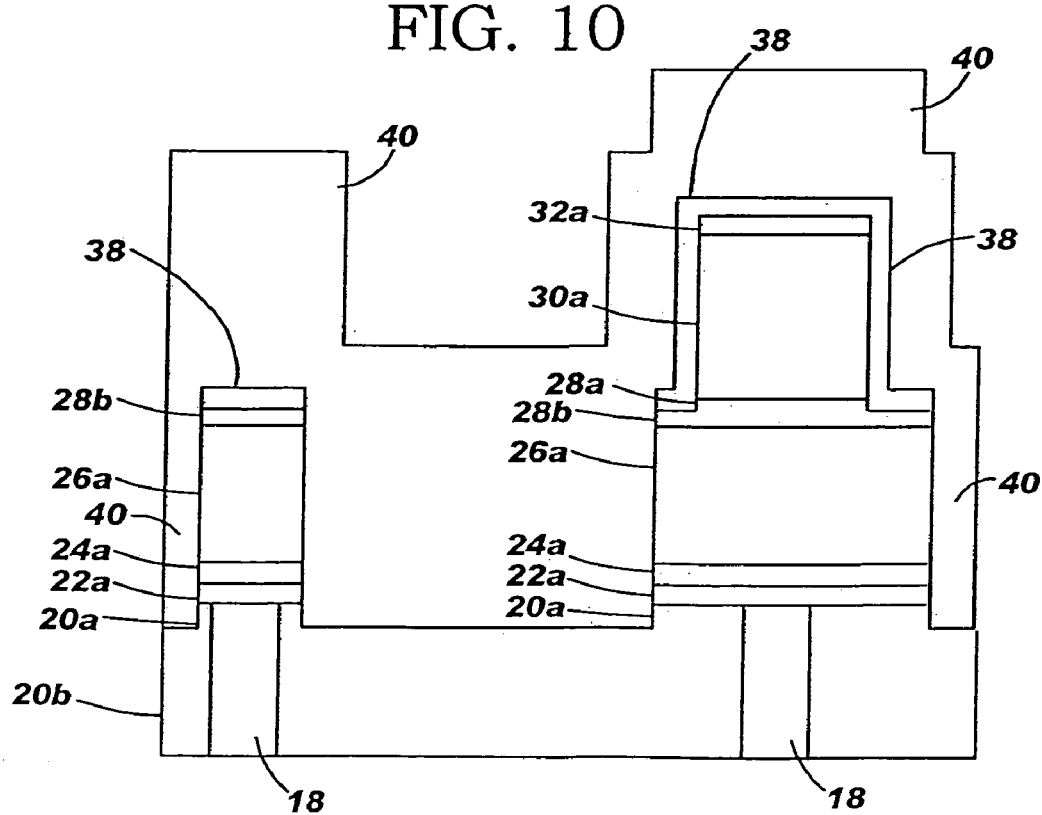
FIG. 10 is cross sectional view of the structure of FIG. 9 with the addition of a dielectric layer.
Figure 11:
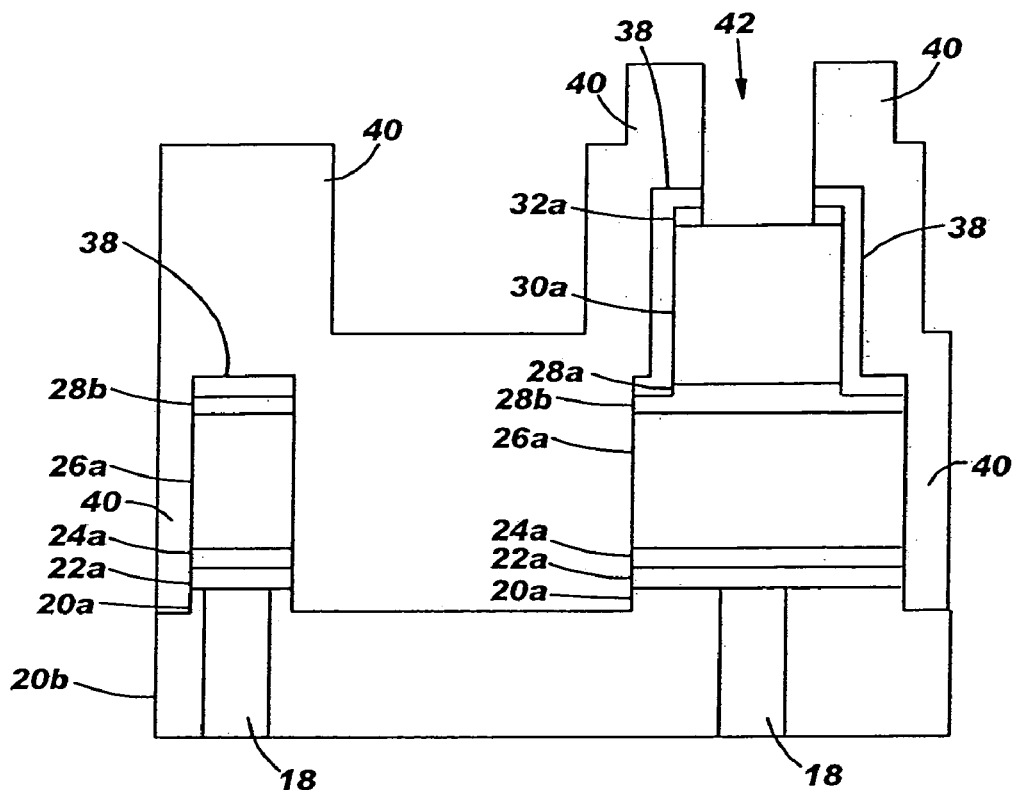
FIG. 11 is cross sectional view of the structure of FIG. 10 after patterning and etching of a portion of the dielectric layer.
Figure 12:
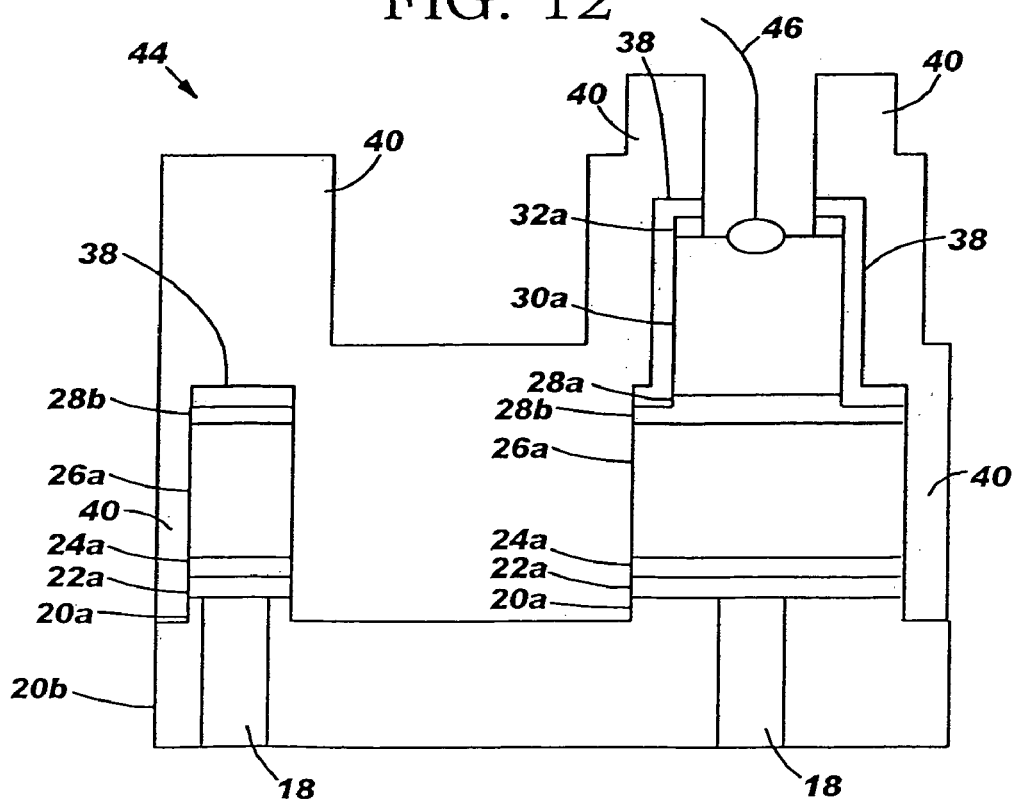
FIG. 12 is cross sectional view of the structure of FIG. 11 after the attachment of a wirebond.

Once the wirebond pad and wiring layers are formed as above, a dielectric passivating film made of layers such as 1 µm $SiO_2$, 0.5 µm SiN and 6 µm polyimide may be deposited over the structure of FIG. 7 or 9. FIG. 10 shows the application of such a dielectric composite layer 40 over the structure of FIG. 9. Thereafter, the dielectric layer 40 and top TiN layer 32*a* are patterned and etched to create an opening 42 over the wirebond pad 30*a*, to permit direct contact with the conductive surface, as shown in FIG. 11. Alternatively, layer 32*a* may be only partially etched. After the device 44 is diced to separate it from the remaining structure and packaged, a wirebond 46 is attached from the package to the surface of wirebond pad 30*a* of device 44 by conventional means (FIG. 12) to create the interconnect structure to connect the device within the microelectronic chip semiconductor package (not shown). The thickness of the wirebond pad layer 30*a* extends above the last wiring layer 26*a* to permit a wirebond contact that achieves suitable strength, without increasing the thickness of the last wiring level 26*a*.

This invention can also be used to form tight pitch (e.g., 0.5–1 μm) wiring and relaxed pitch (e.g., greater than 2 μm) wiring for other device applications. The relaxed pitch wiring consists primarily of both the upper and lower wiring structures as shown in upper aluminum layer 30*a* and lower aluminum level 26*a* (FIGS. 7 and 11), but also includes layers 22*a*, 24*a*, 28, 30 and 32. Since these conductors are in parallel, they act as one wire. For example, the relaxed pitch wiring could be used to fabricate devices such as spiral inductors or transmission lines.

Thus, the present invention provides an improved method and structure for connecting wirebonds of approximately 50 μm and smaller ball size to the last metal interconnect on a microelectronic device, or for forming other devices, without adding significant additional structure.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A structure for connecting a microelectronic device to a wirebond comprising:
   a substrate having a microelectronic circuit therein;
   a wiring layer over the substrate; and
   a bilayer wiring structure comprising upper and lower electrically conductive layers separated by a protective electrically conductive layer, wherein the protective electrically conductive layer has a thickness substantially less than the upper and lower layers of the bilayer structure, the lower layer of the bilayer structure being at the level of the wiring layer and the upper layer of the bilayer structure extending above the level of the wiring layer.

2. The structure of claim 1 further including a wirebond connected to the upper layer of the bilayer structure.

3. The structure of claim 1 wherein the wiring layer has a thickness no greater than about 500 nm.

4. The structure of claim 1 wherein the lower layer of the bilayer structure has substantially the same thickness as the wiring level.

5. The structure of claim 1 wherein the lower and upper layers of the bilayer structure each have substantially the same thickness as the wiring level.

6. The structure of claim 1 wherein the wiring layer and upper and lower layers of the bilayer structure comprise aluminum or an aluminum alloy.

7. The structure of claim 1 wherein the protective electrically conductive layer is a refractory selected from the group consisting of TiN, TaN, TiSiN, WN, W, Ta, TiAl or combinations thereof.

8. A microelectronic device structure comprising:
   a substrate having a microelectronic circuit therein;
   a wiring layer over the substrate; and
   a bilayer wiring structure comprising upper and lower electrically conductive layers separated by a protective electrically conductive layer, wherein the protective electrically conductive layer has a thickness substantially less than the upper and lower layers of the bilayer structure, the lower layer of the bilayer structure being at the level of the wiring layer and having substantially the same thickness, and the upper layer of the bilayer structure extending above the level of the wiring layer, the bilayer wiring structure being connected in parallel and forming a device.

9. The structure of claim 8 wherein the bilayer wiring forms a spiral inductor or transmission line.

10. A method for connecting a microelectronic device to a wirebond comprising:
    providing a substrate having a microelectronic circuit therein;
    forming a wiring layer over the substrate including a bilayer wiring structure comprising upper and lower electrically conductive layers separated by a protective electrically conductive layer, wherein the protective electrically conductive layer has a thickness substantially less than the upper and lower layers of the bilayer structure, the lower layer of the bilayer structure being at the level of the wiring layer and the upper layer of the bilayer structure extending above the level of the wiring layer; and
    connecting a wirebond to the upper layer of the bilayer structure.

11. The method of claim 10 wherein the bilayer wiring structure is formed by depositing the upper and lower electrically conductive layers separated by a protective electrically conductive layer over the substrate, etching the upper electrically conductive layer and a portion of the protective electrically conductive layer, and thereafter separately etching the lower electrically conductive layer to form the wiring layer over the substrate.

12. The method of claim 10 wherein the wiring layer has a thickness no greater than about 500nm.

13. The method of claim 10 wherein the lower layer of the bilayer structure has substantially the same thickness as the wiring level.

14. The method of claim 10 wherein the lower and upper layers of the bilayer structure each have substantially the same thickness as the wiring level.

15. The method of claim 10 wherein the wiring layer and upper and lower layers of the bilayer structure comprise aluminum or an aluminum alloy.

16. The method of claim 11 wherein the lower layer of the bilayer structure has substantially the same thickness as the wiring level.

17. The method of claim 11 wherein the lower and upper layers of the bilayer structure each have substantially the same thickness as the wiring level.

18. The method of claim 11 wherein the protective layer has a thickness substantially less than the upper and lower layers of the bilayer structure.

19. A method of making a microelectronic device structure comprising:

provniding a substrate having a microelectronic circuit therein;

forming a wiring layer over the substrate; and forming a bilayer wiring structure comprising upper and lower electrically conductive layers separated by a protective electrically conductive layer, wherein the protective electrically conductive layer has a thickness substantially less than the uoner and lower layers of the bilayer structure, the lower layer of the bilayer structure being at the level of the wiring layer and having substantially the same thickness, and the upper layer of the bilayer structure extending above the level of the wiring layer, the bilayer wiring structure being connected in parallel and forming a device.

20. The method of claim 19 wherein the bilayer wiring forms a spiral inductor or transmission line.

\* \* \* \* \*